(12) United States Patent
Guske

(10) Patent No.: US 9,691,513 B1
(45) Date of Patent: Jun. 27, 2017

(54) PEDESTAL ALIGNMENT TOOL FOR AN ORIENTER PEDESTAL OF AN ION IMPLANT DEVICE

(71) Applicant: GLOBALFOUNDRIES Inc., Grand Cayman (KY)

(72) Inventor: Jochen Guske, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/185,185

(22) Filed: Jun. 17, 2016

(51) Int. Cl.
*G21K 5/10* (2006.01)
*H01J 37/08* (2006.01)

(52) U.S. Cl.
CPC ............... *G21K 5/10* (2013.01); *H01J 37/08* (2013.01); *H01J 2237/31701* (2013.01)

(58) Field of Classification Search
USPC ........................................ 250/442.11, 492.21
See application file for complete search history.

(56) References Cited

U.S. PATENT DOCUMENTS 4,842,683 A * 6/1989 Cheng ............... H01J 37/32431
156/345.37

FOREIGN PATENT DOCUMENTS

EP  0246117 A2  11/1987

OTHER PUBLICATIONS

Varian Semiconductor Equipment Brochure entitled Orienter Lift Up/Down Alignment, E8229570, Revision A, 2011.

* cited by examiner

*Primary Examiner* — Kiet T Nguyen
(74) *Attorney, Agent, or Firm* — Amerson Law Firm, PLLC

(57) ABSTRACT

A pedestal alignment tool for adjusting an orienter pedestal of an ion implant device is provided, wherein the pedestal is configured to orient a wafer prior to implantation in the ion implant device, the pedestal alignment tool comprising supporting elements configured for contacting a surface of the pedestal, a base comprising a top surface and openings for receiving the supporting elements, and adjustment means configured for adjusting lengths of the supporting elements over which the supporting elements protrude from the top surface of the base.

18 Claims, 2 Drawing Sheets

PEDESTAL ALIGNMENT TOOL FOR AN ORIENTER PEDESTAL OF AN ION IMPLANT DEVICE

BACKGROUND

1. Field of the Disclosure

Generally, the present disclosure relates to the field of integrated circuits and semiconductor devices and, more particularly, to an ion implant device comprising an orienter pedestal for orienting a wafer before it is transferred for implantation processing to a process platen of the ion implant device.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, MOS technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer.

Generally, a set of processing steps is performed on a lot of wafers using a variety of process tools, including photolithography steppers, etch tools, deposition tools, polishing tools, rapid thermal process tools, implantation tools, etc. The technologies underlying semiconductor process tools have attracted increased attention over the last several years, resulting in substantial refinements. However, despite the advances made in this area, many of the process tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can result in non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Ion implantation is a very complex and widely used process in the manufacture of integrated circuit devices. Ion implantation is a technique used to implant a dopant material, e.g., arsenic or boron, into a structure, e.g., a substrate, to form very precise implant regions having a certain dopant concentration and profile. Ion implantation processes may also be performed to implant dopant materials into a layer of material. Very precise control of ion implantation processes is desirable because of the impact the implant regions may have on the performance capabilities of the ultimate integrated circuit product. For example, precise control of the ion implantation processes performed to form the source/drain regions for a transistor or to control the threshold voltage of the transistor is required if the ultimate devices are to operate as intended. Typically, in modern semiconductor manufacturing facilities, ion implantation processes are performed on a group or batch of substrates, e.g., wafers. The number of substrates processed in each batch may vary depending on the ion implant equipment used to perform the process. Most of the batch-type ion implant equipment may perform the ion implant process on 13 or 17 wafers at a time. There is great interest in attempting to insure that the processes performed in such ion implant tools are performed correctly. Moreover, in some cases, if the ion implant processes are performed incorrectly, the substrates subjected to such incorrect processes must be destroyed. That is, it is very difficult, if not impossible, to rework substrates subjected to erroneous ion implant processes.

Ion implantation processes are very complex, and the successful performance of such ion implantation processes depends on a number of related parameters of the process, e.g., implant dose, implant energy level, gas flow rates, the current and voltage levels of the filament, ion beam current, number of scans, etc. To achieve a desired to targeted result, modern ion implant equipment may automatically adjust or tune the ion beam prior to performing an implant process in an effort to insure that the implant process performed by the tool will produce acceptable results. That is, the ion implant tool attempts to tune or adjust a plurality of these related parameters such that a selected combination of these parameters will produce the intended results. The tuning process is a relatively time-consuming process.

In an implantation device, accurate wafer orientation before wafer transfer to a process platen by means of an orienter pedestal is mandatory. In particular, the accurate orienter lift up/down alignment of an implanter is difficult and time-consuming. The alignment of the orienter lift up and down positions ensures that the wafer is smoothly transferred to and from the orienter wafer lift chuck without slippage or damage. An exactly adjusted height of the orienter pedestal is mandatory for successful wafer orientation. The alignment is conventionally based on an orient up gauge and an orient down gauge. Since original calibration gauges provided by suppliers are usually not accurate enough to guarantee a satisfying alignment, the accurate orienter lift up/down alignment poses severe problems when using an implantation device.

With respect to conventional orienter lift up/down alignment it is referred, for example, to a manual by Varian Semiconductor Equipment, Orienter Lift Up/Down, Alignment, E82295700, Revision A, 10/2011 (Alignment procedure for Universal End Station X, Orienter E11320430); see also EP0246117A2. The cumbersome conventional alignment procedure comprises the steps of raising an orienter to an up position, rotating robot arms to the orienter, checking the orienter lift up position, adjusting the orienter pedestal height, lowering orienter to down position, checking the orienter lift down position and initializing a robot arm followed by robot to orienteralignment (see above-mentioned manual by Varian Semiconductor Equipment). The step of checking the orienter lift up position comprises placing the up gauge onto the wafer lift chuck so that an alignment pin of the gauge is inserted into a hole in the center of the wafer lift chuck and rotating the gauge so that an open slot is oriented towards a higher robot end-effector followed by using a robot arm to manually move a higher end-effector towards the wafer lift chuck and verifying that the end-effector fits into the open slot of the gauge and just touches the bottom of the slot. Adjusting the orienter pedestal height comprises loosening a split clamp screw and two additional screws and, after the adjustment, usually, the step of checking the orienter lift up position has to be repeated, etc. The step of lowering the orienter to the down position comprises placing the down gauge onto the wafer lift chuck so that an alignment pin of the gauge is inserted into a hole in the center of the wafer lift chuck and rotating the gauge so that an open slot is oriented towards a higher robot end-effector followed by using a robot arm to manually move a higher end-effector towards the wafer lift chuck and verifying that the end-effector fits into the open slot of the gauge and just touches the bottom of the slot.

In view of the above, there is a need for a tool for orienter pedestal alignment (orienter pedestal lift up/down alignment) of an ion implanter that is easy to use with a high reproducibility.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to ion implantation devices and, more particularly, to the alignment/adjustment of an orienter pedestal used for orienting/aligning a substrate (wafer) before the wafer is transferred to a process platen for an implantation procedure. The orienter pedestal is part of an orienter and supports the wafer during the orientation process.

A pedestal alignment tool is provided for adjusting a pedestal (an orienter pedestal) of an ion implant device, wherein the pedestal is configured to orient a wafer (substrate) prior to implantation in the ion implant device, the pedestal alignment tool comprising supporting elements configured for contacting a (bottom) surface of the pedestal, a base comprising a top surface and openings for receiving the supporting elements and adjustment means configured for adjusting lengths of the supporting elements over which the supporting elements protrude from the top surface of the base (in the direction towards the lower surface of the pedestal; the wafer is to be supported on an upper surface of the pedestal).

In an illustrative embodiment, a method of adjusting an orienter pedestal of an ion implant device includes the step of providing a pedestal alignment tool, the pedestal alignment tool comprising supporting elements configured for contacting a surface of the orienter pedestal, a base comprising a top surface and openings for receiving the supporting elements and adjustment means configured for adjusting lengths of the supporting elements over which the supporting elements protrude from the top surface of the base. The method further includes placing the pedestal alignment tool below the orienter pedestal and adjusting the supporting elements in contact with a lower surface of the pedestal (orienter pedestal lift up/down alignment) in order to perform accurate alignment of the height of the pedestal.

BRIEF DESCRIPTION OF THE DRAWINGS

The disclosure may be understood by reference to the following description taken in conjunction with the accompanying drawings, in which like reference numerals identify like elements, and in which.

Figure 1:
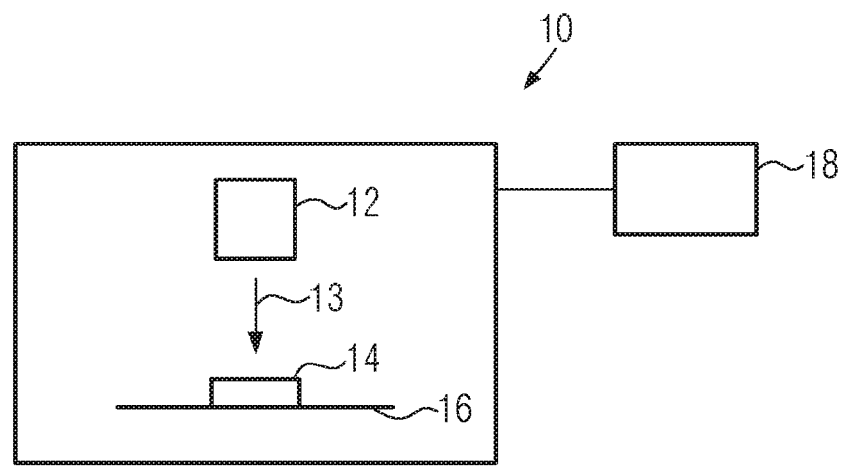
FIG. 1 illustrates very schematically an ion implant device wherein an orienter pedestal alignment tool can be used in accordance with the present invention.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, ion implantation techniques in the context of manufacturing semiconductor devices in which N-channel transistors and/or P-channel transistors and memory cells may be formed are described herein. The ion implantation techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices, etc., in principle. The techniques and technologies described herein may be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

The present disclosure, generally, provides an ion implant device wherein an orienter pedestal alignment tool for alignment of an orienter pedestal used for orienting/aligning a substrate that is to be transferred to a process platen for ion implantation is disclosed.

FIG. 1 illustrates very schematically an ion implant device 10 wherein an orienter pedestal alignment tool may be used in accordance with the present invention. The ion implant device 10 is intended to be illustrative in nature in that it is representative of any of a variety of commercially available ion implant devices. For example, in one illustrative embodiment, the ion implant device 10 may be an ion implanter manufactured by Varian. The ion implant device 10 is comprised of a schematically depicted ion source 12 that is used to generate ions, as indicated by the arrow 13, that are implanted into a substrate 14 positioned in the ion implant device 10. The substrate 14 is held in place within the ion implant device 10 by means of a (wafer) platen 16 that may include an electrostatic chuck. The platen 16 may, in some cases, hold single or multiple wafers, i.e., serial or batch processing configurations. Of course, as will be understood by those skilled in the art, a typical ion implant tool 10 is a very complex piece of equipment that contains many components not depicted in FIG. 1. The relative positioning of the substrate 14 and the ion source 12 is provided by way of example only.

Moreover, the ion implant device 10 may contain means for moving the substrates 14 while the implantation process is being performed. In addition, electromagnetic lenses for guiding the ion beam may be provided. Thus, the particular configuration of the schematically depicted ion implant tool 10 should not be considered a limitation of the present invention. It should also be noted that the present invention may also be employed with ion implant devices that process a plurality of substrates at a time. A controller 18 may be operatively coupled to the ion implant device 10 and it may be any type of device capable of executing instructions. In some embodiments, the controller 18 may be a microprocessor or a computer. The controller 18 may be resident on the ion implant device 10, it may be a stand-alone device, or it may be part of an overall computer system that is adapted to control one or more aspects of the operations performed in an integrated circuit manufacturing facility. The controller 18 may be employed to perform various functions described herein. The functions performed by the controller 18 may be performed by multiple computing resources.

An exemplary information exchange and process control framework suitable for use in such a manufacturing system is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (GIM) Framework compliant system technologies and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI, which is headquartered in Mountain View, Calif., USA.

The substrate 14 depicted in FIG. 1 is intended to be representative in nature as the present invention may be employed in the context of implanting ions into substrates comprised of a variety of different materials, e.g., silicon, silicon-on-insulator (SOI) structures, III-V materials, etc. The present invention may also be employed in the context of implanting dopant material into a previously formed layer of material. Moreover, the present invention may be employed when implanting a variety of different types of dopant materials, e.g., N-type dopant materials, such as phosphorous (P) or arsenic (As), or P-type dopant materials, such as boron (B) or boron difluoride ($BF_2$). Thus, the present invention should not be considered as limited to the implantation of any particular type of dopant materials and implantation applications. In particular, the substrate 14 may be processed for manufacturing a plurality of (MOS)FET devices. Implantation may be carried out in the ion implant device 10 in order to form N-wells/P-wells, N-channel regions/P-channel regions, N-channel halo regions/P-channel halo regions, source/drain regions, source/drain extension regions, etc.

Figure 2:
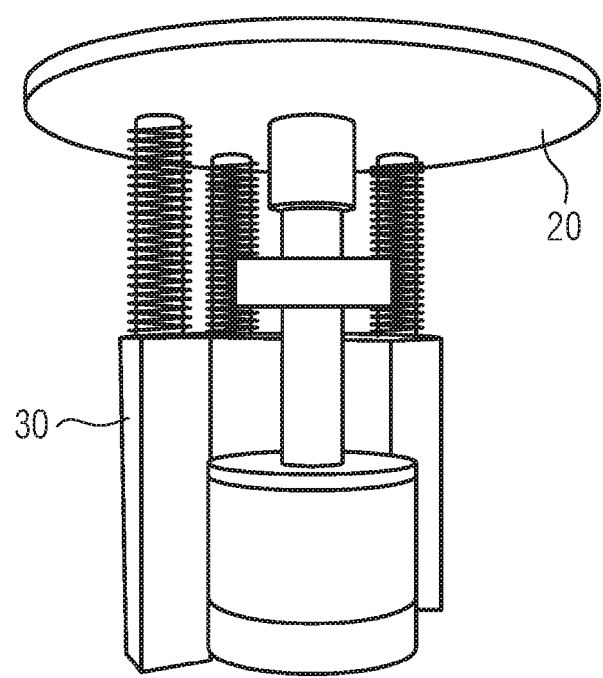
FIG. 2 illustrates a pedestal and an alignment tool for adjusting the pedestal according to an embodiment.
Figure 3A:
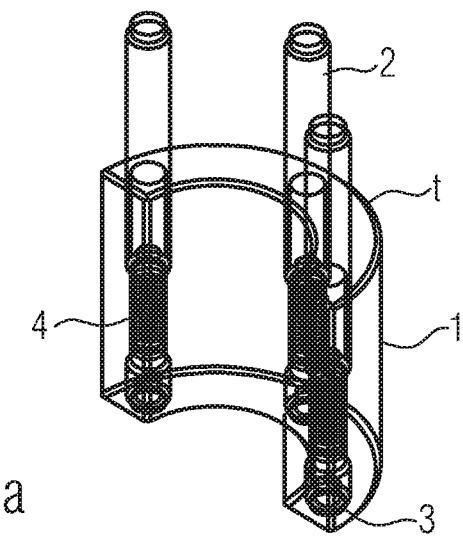
FIGS. 3a-3c illustrate a pedestal alignment tool according to an embodiment.
Figure 3B:
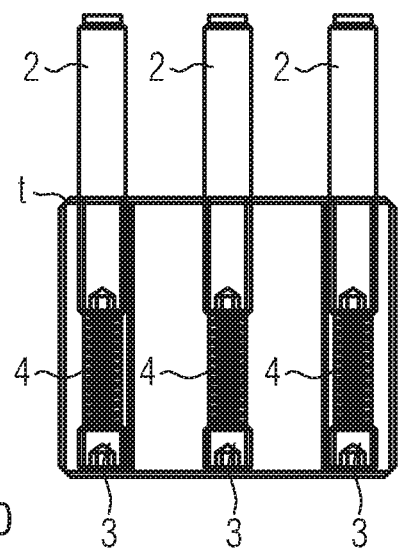
Figure 3C:
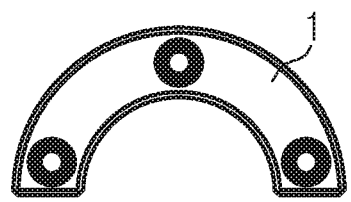

FIG. 2 shows an example of an orienter pedestal 20 that is aligned/adjusted by means of an alignment tool 30 according to an illustrative embodiment. Orienter pedestal 20 is a part of an orienter and supports a substrate during an orientation process. After alignment to a predefined angle, the substrate may be transferred to a process platen. The alignment tool 30 is shown in detail in FIGS. 3a-3c. The alignment tool comprises a base 1 comprising a top surface t, three turnbuckles 2, three threaded pins (grub screws) 3 and three pressure springs 4. The spring-loaded turnbuckles 2 functioning as alignment screws may be easily adjusted with respect to each other with respect to the length over which they protrude from the top surface t of the base 1 in the direction of the orienter pedestal 20 shown in FIG. 2 in order to provide for accurate alignment of the orienter pedestal 20. The entire alignment tool may be removed at any time and may be re-installed without any need for cumbersome re-adjustment. Alignment of the (orienter) pedestal can, therefore, be readily performed without the need of gauges and the associated time-consuming alignment procedures as detailed in the description of the prior art above.

For the alignment process, only one single alignment tool 30 is necessary according to the present disclosure and it is highly re-usable, since the turnbuckles 2 are maintained in their positions even after removal of the alignment tool 30 from a particular ion implantation device. Moreover, the alignment tool 30 is very flexible in use, since it provides the possibility of adjustment to pedestals at different heights. During the alignment, no movement of robot arms is necessary at all. Thus, the pedestal alignment necessary during tuning of an implanter is both simplified and accelerated as compared to the art.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A pedestal alignment tool for adjusting a pedestal of an ion implant device, wherein said pedestal is configured to orient a wafer prior to implantation in said ion implant device, said pedestal alignment tool comprising:
supporting elements configured for contacting a surface of said pedestal;
a base comprising a top surface and openings for receiving said supporting elements; and
adjustment means configured for adjusting lengths of said supporting elements over which said supporting elements protrude from said top surface of said base.

2. The pedestal alignment tool of claim 1, wherein said supporting elements are turnbuckles.

3. The pedestal alignment tool of claim 2, wherein said turnbuckles are spring-loaded turnbuckles.

4. The pedestal alignment tool of claim 2, wherein said turnbuckles are made of stainless steel.

5. The pedestal alignment tool of claim 1, wherein said adjustment means comprise spring elements.

6. The pedestal alignment tool of claim 5, wherein said spring elements are pressure springs.

7. The pedestal alignment tool of claim 5, further comprising threaded pins supporting said spring elements.

8. The pedestal alignment tool of claim 1, wherein said base is made of stainless steel.

9. The pedestal alignment tool of claim 1, wherein said base has a geometrical shape of a half cylinder.

10. The pedestal alignment tool of claim 1, wherein said supporting elements consist of exactly three supporting elements.

11. A pedestal alignment tool for adjusting a pedestal of an ion implant device, wherein said pedestal is configured to orient a wafer prior to implantation in said ion implant device, said pedestal alignment tool comprising:
a plurality of spring-loaded turnbuckles configured for contacting a surface of said pedestal;
a base comprising a top surface and openings for receiving said plurality of spring-loaded turnbuckles; and
a plurality of spring elements, each of which engages a corresponding one of said spring-loaded turnbuckles so as to adjust a distance by which the spring-loaded turnbuckle protrudes above said top surface of said base.

12. The pedestal alignment tool of claim 11, wherein said spring elements are pressure springs.

13. The pedestal alignment tool of claim 11, further comprising a plurality of threaded pins, each of which engages a corresponding one of said spring elements.

14. The pedestal alignment tool of claim 11, wherein said base has a geometrical shape of a half cylinder.

15. The pedestal alignment tool of claim 14, wherein said plurality of spring-loaded turnbuckles consists of exactly three plurality of spring-loaded turnbuckles.

16. The pedestal alignment tool of claim 11, wherein said plurality of spring-loaded turnbuckles consists of exactly three plurality of spring-loaded turnbuckles.

17. A method of adjusting an orienter pedestal of an ion implant device, comprising:
providing a pedestal alignment tool, said pedestal alignment tool comprising supporting elements configured for contacting a surface of said orienter pedestal, a base comprising a top surface and openings for receiving said supporting elements and adjustment means configured for adjusting lengths of said supporting elements over which said supporting elements protrude from said top surface of said base;
placing said pedestal alignment tool below said orienter pedestal; and
adjusting said supporting elements in contact with a lower surface of said orienter pedestal in order to perform alignment of a height of said orienter pedestal.

18. The method of claim 17, wherein said supporting elements are turnbuckles and adjusting said supporting elements comprises screwing at least one of said turnbuckles.

* * * * *